United States Patent [19]

Maruyama

[11] Patent Number: 6,069,527
[45] Date of Patent: May 30, 2000

[54] FEED FORWARD AMPLIFIER

[75] Inventor: Satoshi Maruyama, Kawasaki, Japan

[73] Assignee: Fujitsu Limited, Kanagawa, Japan

[21] Appl. No.: 09/152,964

[22] Filed: Sep. 14, 1998

[30] Foreign Application Priority Data

Mar. 10, 1998 [JP] Japan ................................. 10-057933

[51] Int. Cl.⁷ ................................ H03F 3/66; H03F 1/26
[52] U.S. Cl. ............................... 330/51; 330/52; 330/151
[58] Field of Search ............................... 330/51, 52, 129, 330/136, 149, 151

[56] References Cited

U.S. PATENT DOCUMENTS

| | | | |
|---|---|---|---|
| 5,077,532 | 12/1991 | Obermann et al. | 330/151 |
| 5,430,410 | 7/1995 | Ragnaud et al. | 330/136 X |
| 5,912,586 | 6/1999 | Mitzlaff | 330/149 |

FOREIGN PATENT DOCUMENTS 0010051  1/1977  Japan ...................................... 330/151

*Primary Examiner*—Steven J. Mottola
*Attorney, Agent, or Firm*—Helfgott & Karas, P. C.

[57] ABSTRACT

A feed foward amplifier including a first amplifier for amplifying a first input signal; an extraction unit for extracting a distortion element added to a second signal output from the first amplifier; a second amplifier for amplifying the distortion element; an adder for inverting the phase of either the second signal or of a third signal output from the amplifier and for adding these signals; and a controller for controlling the supply of power to the second amplifier based on a level of the first terminal. When the controller ascertains that the detected level is equal to or greater than the reference level, the controller unit powers on the second amplifier. When the detected level is lower than the reference level, the controller powers off the second amplifier. Thus, since the power to the second amplifier is switched off when the volume of traffic is low, the consumption of power is reduced.

18 Claims, 10 Drawing Sheets

FEED FORWARD AMPLIFIER

BACKGROUND OF THE INVENTION

1. Field of the Invention

The present invention relates to a feed forward amplifier which is employed as a power amplification apparatus in a radio base station for mobile telephones, such as car telephones or portable telephones.

2. Related Arts

Recently, the employment of mobile telephones, such as car telephones or portable telephones, has spread rapidly, and the number of radio base stations established to receive and relay radio waves originating at mobile telephones has also been increased. Such radio base is stations employ incorporated power amplification apparatuses for amplifying received radio waves and for relaying the resultant waves.

FIG. 9 is a block diagram illustrating a feed forward amplifier constituting a power amplification apparatus. In FIG. 9, an electrical signal S1 having a plurality of frequency elements is input to a feed forward amplifier. Subsequently, the electrical signal S1 is amplified by a main amplifier 1. At this time, a distortion element having a frequency differing from the frequency element of the electrical signal S1 appears as noise in an electrical signal S2, which is produced by amplification of the electrical signal S1.

Simultaneously, electrical signal S3 is produced when a delay circuit 2 shifts the phase of one part of the electrical signal S1 180 degrees. And when the thus produced electrical signal S3 and the electric signal S2 carrying the distortion element are synthesized by a directional coupler 6, an electric signal S4 carrying only the distortion element is produced. Thereafter, the electrical signal S4 is amplified to a predetermined level by an auxiliary amplifier 4, and the resultant signal is transmitted to an adder 5.

The adder 5 also receives the electrical signal S3, which was produced when the electrical signal S1 was shifted 180 degrees by the delay circuit 3. Then, when the electrical signal S2 having both a signal element and a distortion element and the electrical signal S4 having only a distortion element are synthesized by the adder 5, the distortion element is canceled out. As a result, an amplified electrical signal S5 which carries no distortion element is output from the adder 5. In this manner, the distortion element is removed from the amplified electrical signal S2.

A power amplification apparatus in which such a feed forward amplifier is employed has a large power consumption, which generally accounts for 60 to 70% of the total power consumed by a radio base station, and the greatest amount of this power is consumed when the radio base station is operating at the maximum transmission power level. But then, even when the transmission output is decreased, there is very little reduction in the power consumption. That is, even when little traffic is being handled by a radio base station and the transmission output is low (e.g., during the night), the radio base station continues to consume a large amount of power. This is true because in a feed forward amplifier, the main amplifier 1 and the auxiliary amplifier 4 are normally A-class amplifiers, so even when the input levels for the electrical signals supplied to these amplifiers are reduced, there is no corresponding reduction in the power consumed by the amplifiers.

In consonance with the above explanation, it is easy to understand that the power consumed by a radio base station greatly affects the operating costs for the station. In addition, contingent upon the need for a large supply power, the size of the power source (battery) installed in a radio base station must be increased, and this militates against there being any reduction in the size of the radio base station. Therefore, the demand has been growing for a method that can optimally control power consumption in accordance with transmission output.

There is one power consumption reduction method, intended for an amplification apparatus for which the transmission output level may become low due to a small traffic volume, for which a power amplification apparatus is constituted by a plurality of feed forward amplifiers, the number of which is reduced when the transmission output volume becomes lower.

In FIG. 10, in a diagram for explaining such a method, is shown the structure of a power amplifier apparatus having four feed forward amplifiers 100. In FIG. 10, a divider 101 for dividing signals input to the feed forward amplifiers 100, and a synthesizer 102 for synthesizing signals output from the feed forward amplifiers 100 are provided before and after the feed forward amplifiers 100. In addition, input switches 103 and output switches 104 are respectively provided between the feed forward amplifiers 100 and the divider 101 and between the feed forward amplifiers 100 and the synthesizer 102. At such time as the transmission output level is at the maximum, all the input switches 103 and the output switches 104 are turned on, and all four of the feed forward amplifiers 100 are set in the operating state. However, when the traffic volume is low, i.e., when the transmission output is but half the maximum, the input and output switches 103 and 104 are rendered conductive/nonconductive, so that only two of the feed forward amplifiers 100 are set in the operating state.

According to this method, however, since a plurality of feed forward amplifiers 100 are provided, a loss in physical deployment flexibility, such as is occasioned by an increase in the size of the power amplification apparatus, occurs. In addition, a power loss in the amplification apparatus, which is attributable to the divider 101, the synthesizer 102 and the input and the output switches 103 and 104, results in an increase in the consumption of power when the transmission output reaches the maximum.

SUMMARY OF THE INVENTION

It is, therefore, one objective of the present invention to provide a feed forward amplifier having a simple structure which reduces the power consumed by a power amplification apparatus in a radio base station when the traffic volume is low.

To achieve the above objective, according to the present invention, a feed forward amplifier comprises:

a first amplifier for amplifying a first input signal;

an extraction unit for extracting a distortion element added to a second signal output from the first amplifier;

a second amplifier for amplifying the distortion element;

an adder for inverting the phase of either the second signal or of a third signal output from the amplifier and for adding these signals; and a controller for controlling the supply of power to the second amplifier based on a level of the first terminal.

This controller includes, for example, a detector for detecting the level of the first signal; a comparator for comparing with a predetermined reference level the level detected by the detector; and a switching unit for powering on and off the second amplifier in accordance with the result provided by the comparison performed by the comparator.

When the comparator ascertains that the detected level is equal to or greater than the reference level, the switching unit powers on the second amplifier. When the detected level is lower than the reference level, the switching unit powers off the second amplifier.

Thus, since the power to the second amplifier is switched off when the volume of traffic is low, the consumption of power is reduced.

DETAILED DESCRIPTION OF THE PREFERRED EMBODIMENTS

Figure 1:
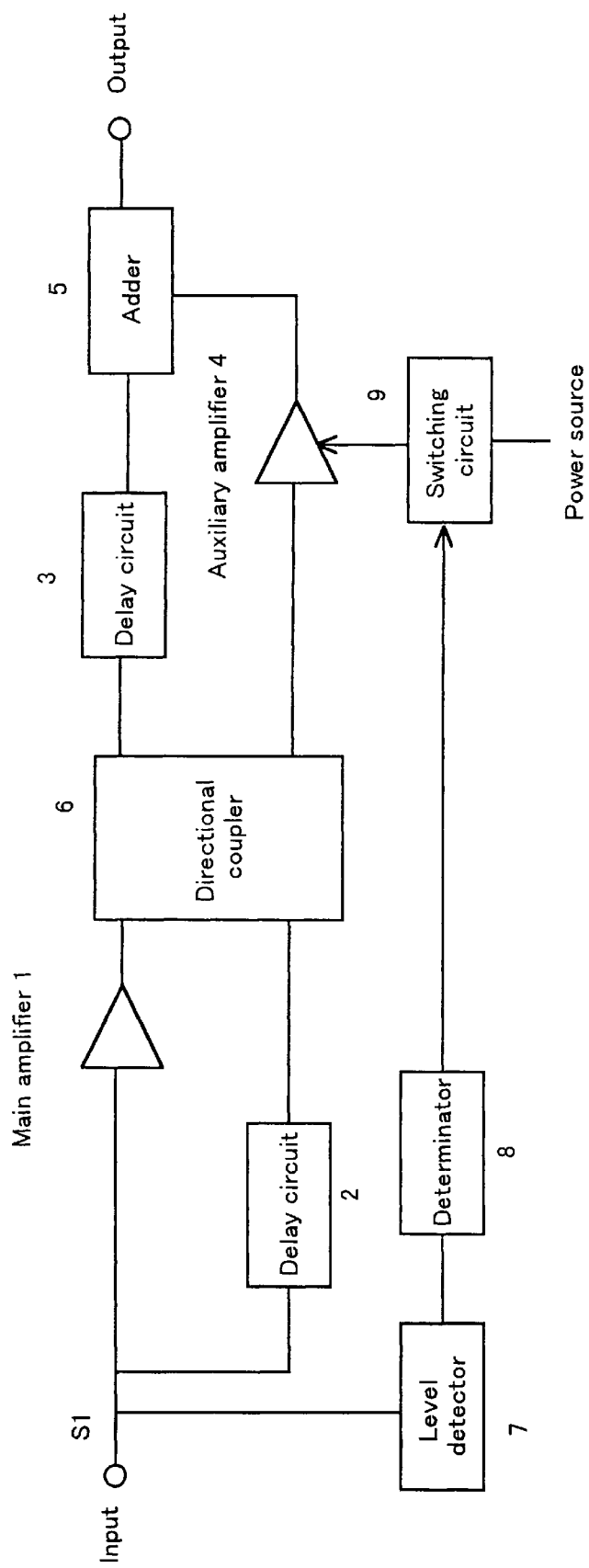
FIG. 1 is a block diagram illustrating the general arrangement of a feed forward amplifier according to the present invention.

The preferred embodiments of the present invention will now be described. It should be noted, however, that the technical scope of the present invention is not limited to these embodiments. Note also that the same reference numerals are used to denote corresponding or identical components in the accompanying drawings.

Figure 9:
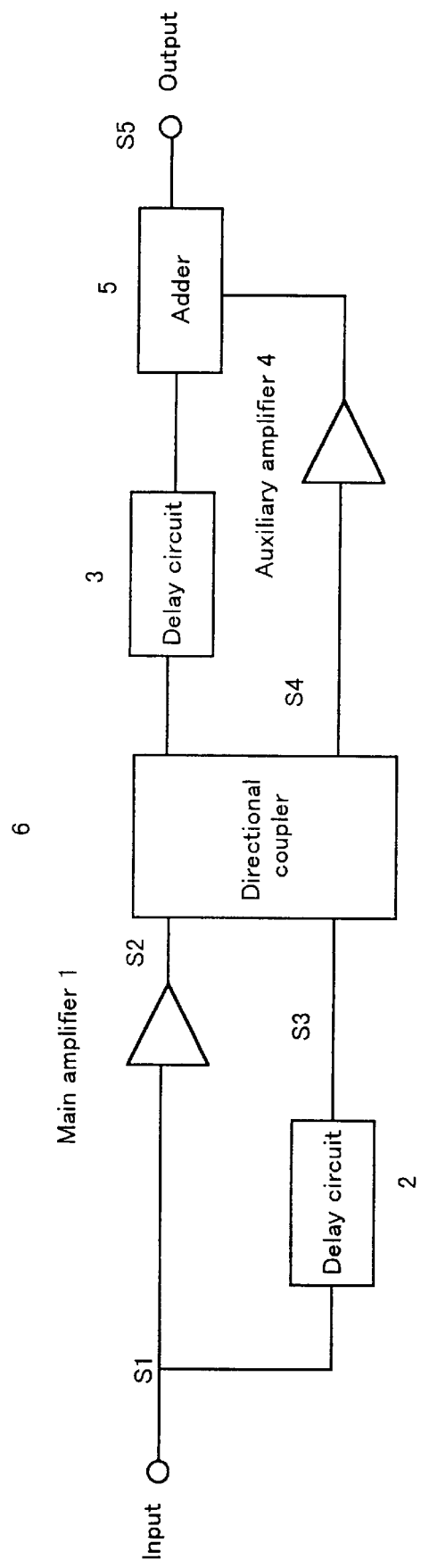
FIG. 9 is a block diagram illustrating a conventional feed forward amplifier.
Figure 10:
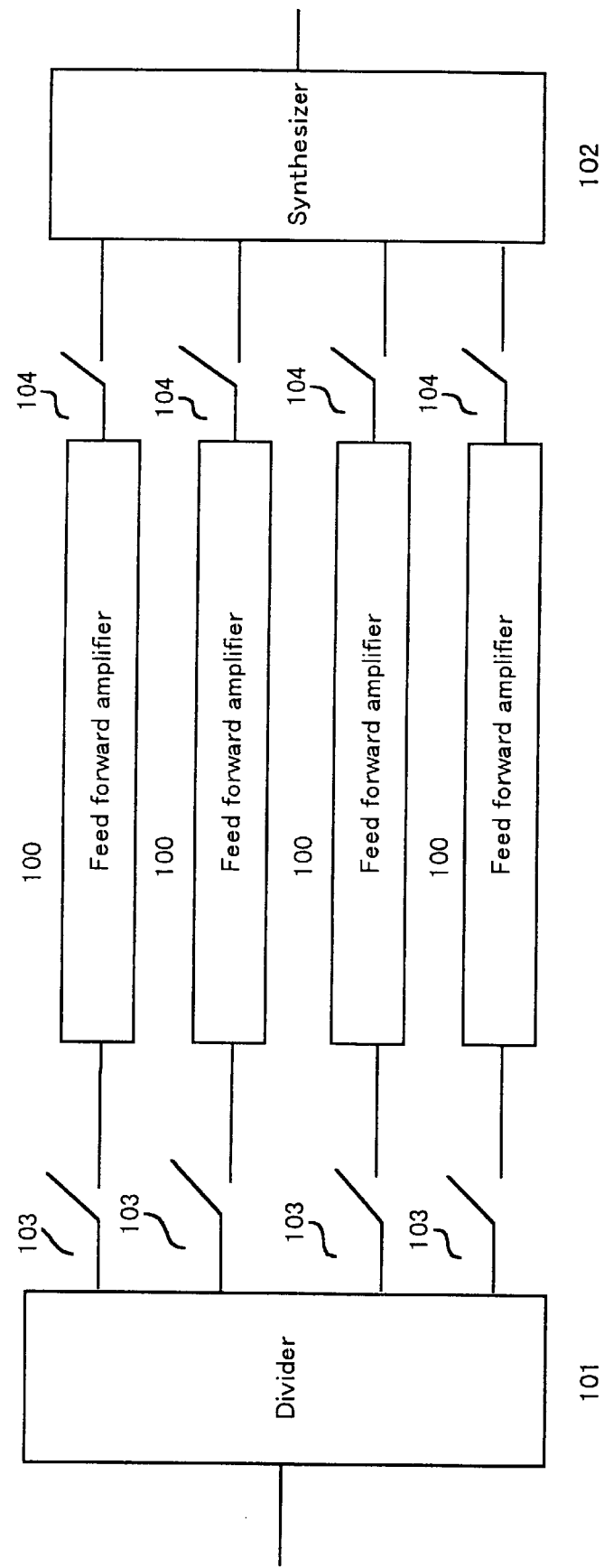
FIG. 10 is a diagram illustrating the arrangement of a conventional feed forward amplification apparatus.

FIG. 1 is a block diagram illustrating the general arrangement of a feed forward amplifier according to the present invention. The feed forward amplifier, as well as the feed forward amplifier in FIG. 9, comprises a main amplifier 1, delay circuits 2 and 3, an auxiliary amplifier 4, an adder 5 and a directional coupler 6. Since the processing involving only these components is the same as that which was previously described, no explanation for it will be given. However, the feed forward amplifier in FIG. 1 further comprises a level detector 7, for detecting the level of an input electrical signal S1; a determiner 8, for determining the detected level; and a switching circuit 9, for turning on or off a power source for the auxiliary amplifier 4.

The supply of power to the auxiliary amplifier 4 is controlled in accordance with the level of the electrical signal S1 input to the feed forward amplifier. Specifically, a distortion element which is generated according to the amplification level of the main amplifier 1 need not be canceled when the level of the electrical signal S1 input to the main amplifier 1 is low and the level of the distortion element is lower than a level appropriate for a required characteristic. Therefore, in this case the auxiliary amplifier 4 need not be operated, and is powered off, so that the consumption of power can be reduced.

Specifically, the level of the input electrical signal S1 is detected by the level detector 7, and the detected level is compared with a predetermined reference level by the determiner 8. When the detected level is lower than the reference level, the switching circuit 9 is rendered non-conductive, and cuts off the auxiliary power amplifier power source. When the detected level is equal to or higher than the reference level, the switching circuit 9 is rendered conductive and powers on the auxiliary amplifier power source. The present invention will now be described in detail.

Figure 2:
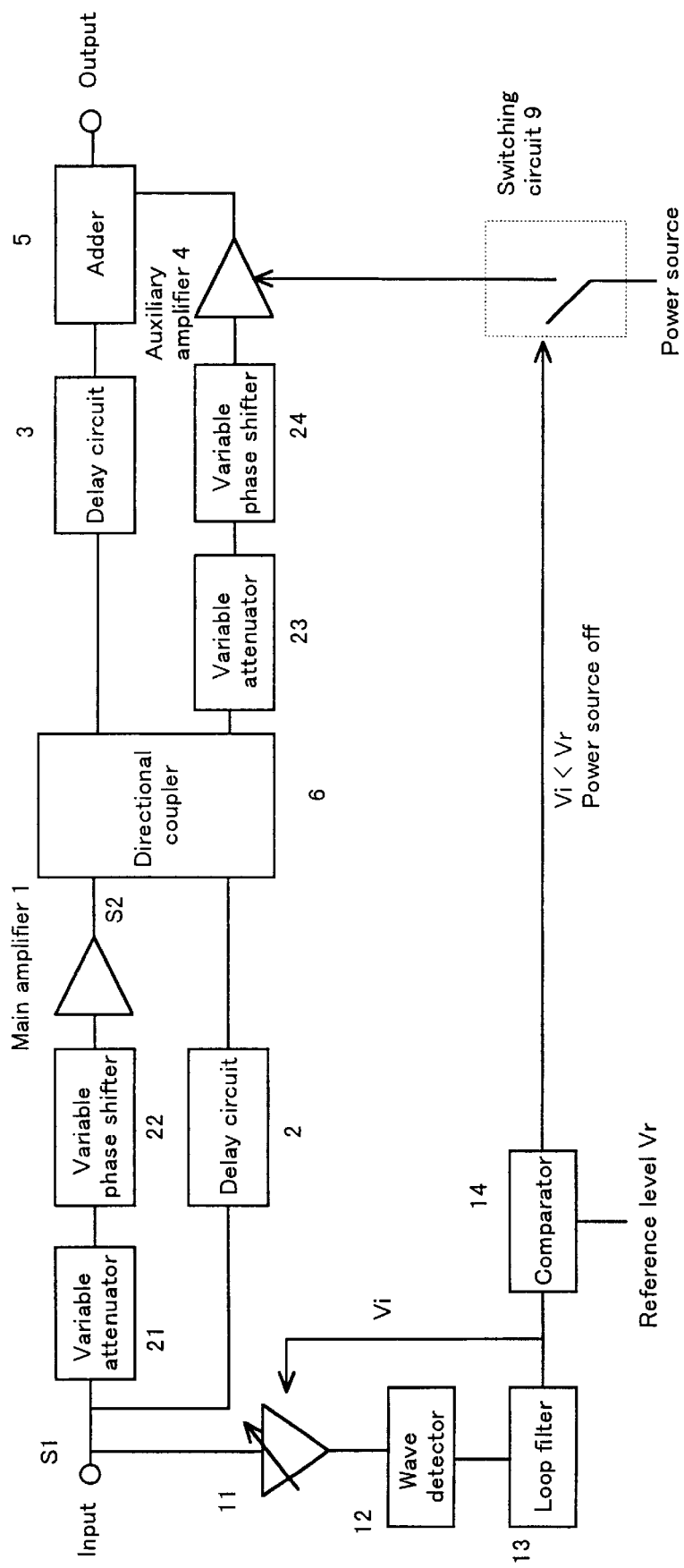
FIG. 2 is a diagram illustrating a feed forward amplifier according to a first embodiment of the present invention.

FIG. 2 is a block diagram illustrating a feed forward amplifier according to a first embodiment of the present invention. In FIG. 2, a level detector 7 includes a variable amplifier 11, a wave detector 12 and a loop filter 13. A determiner 8 includes a comparator 14. One part of an input electrical signal S1 is amplified by the variable amplifier 11, and the resultant signal is detected by the wave detector 12. The high frequency element is removed from the output of the wave detector 12 by the loop filter 13, and the resultant signal is fed back to the variable amplifier 11, which then acts as an automatic gain control (AGC). That is, the amplification rate for the variable amplifier 11 is automatically controlled by a voltage Vi of the direct-current element of the detection output, so that the output of the wave detector 12 is maintained at a constant level.

When the wave detection output is low, the voltage Vi is also lowered, and the amplification rate for the variable amplifier 11 is increased. When the wave detection output is high, the voltage Vi is raised and the amplification rate is reduced. Therefore, the level of the electrical signal S1 can be ascertained by monitoring the voltage Vi.

The voltage Vi is compared with a reference voltage Vr by the comparator 14. When the voltage Vi is lower than the reference voltage Vr, the comparator 14 renders off the switching circuit 9 to power off the auxiliary power amplifier power source. That is, when the voltage Vi is lower than the reference voltage Vr, the level of the electrical signal S1 is low, and the level of a distortion element which is included in an amplified electrical signal S2 is lower than that needed to satisfy a required characteristic. Therefore, since the distortion element need not be canceled, the operation of the auxiliary amplifier 4 is halted.

When the voltage Vi is equal to or higher than the reference voltage Vr, the comparator 14 renders on the switching circuit 9 to power on the auxiliary amplifier power source. That is, when the voltage Vi is equal to or higher than the reference voltage Vr, the level of the electrical signal S1 is equal to or higher than the level needed to satisfy the required characteristic, and the distortion element should be canceled. Therefore, operation of the auxiliary amplifier 4 is initiated.

As is described above, when the level of the electrical signal S1 is low, the power consumed when the traffic is low can be reduced by powering off the auxiliary amplifier power source.

Variable attenuators 21 and 23 and variable phase shifters 22 and 24, which are provided for the feed forward amplifier in FIG. 2, adjust the gains and delays of the main amplifier 1 and the auxiliary amplifier 4 which are changed in accordance with external factors, such as the temperature. This procedure is also employed for the following embodiments.

Figure 3:
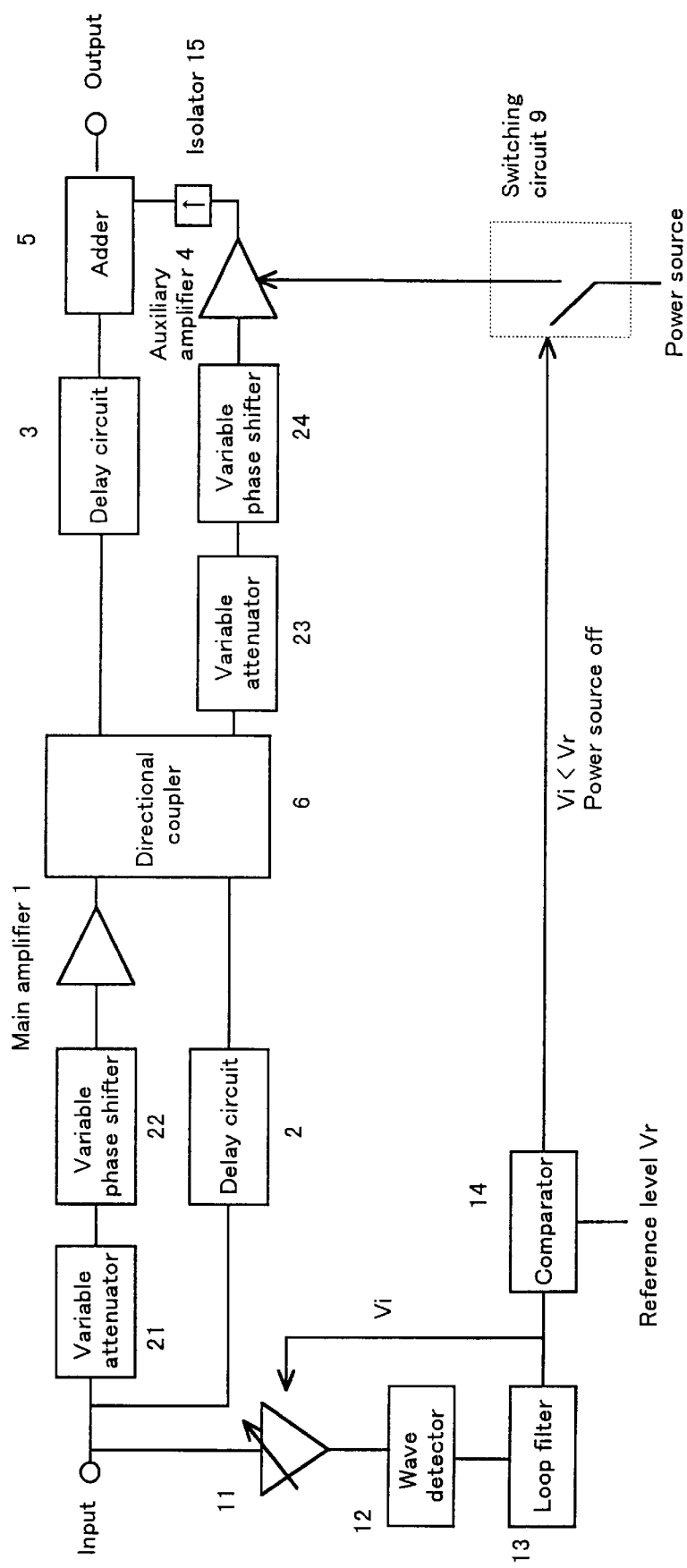
FIG. 3 is a diagram illustrating a feed forward amplifier according to a second embodiment of the present invention.

FIG. 3 is a block diagram illustrating a feed forward amplifier according to a second embodiment of the present invention. In addition to the components in the arrangement in FIG. 2, for the feed forward amplifier in FIG. 3 an isolator 15 is provided between an auxiliary amplifier 4 and an adder 5. The isolator 15 is employed to maintain the gain of an electrical signal S2 obtained by the amplification of an electrical signal in accordance with a change in the output impedance of the auxiliary amplifier 4, which is accompanied by a conductive or non-conductive state of the auxiliary amplifier 4.

Figures 4A, 4B:
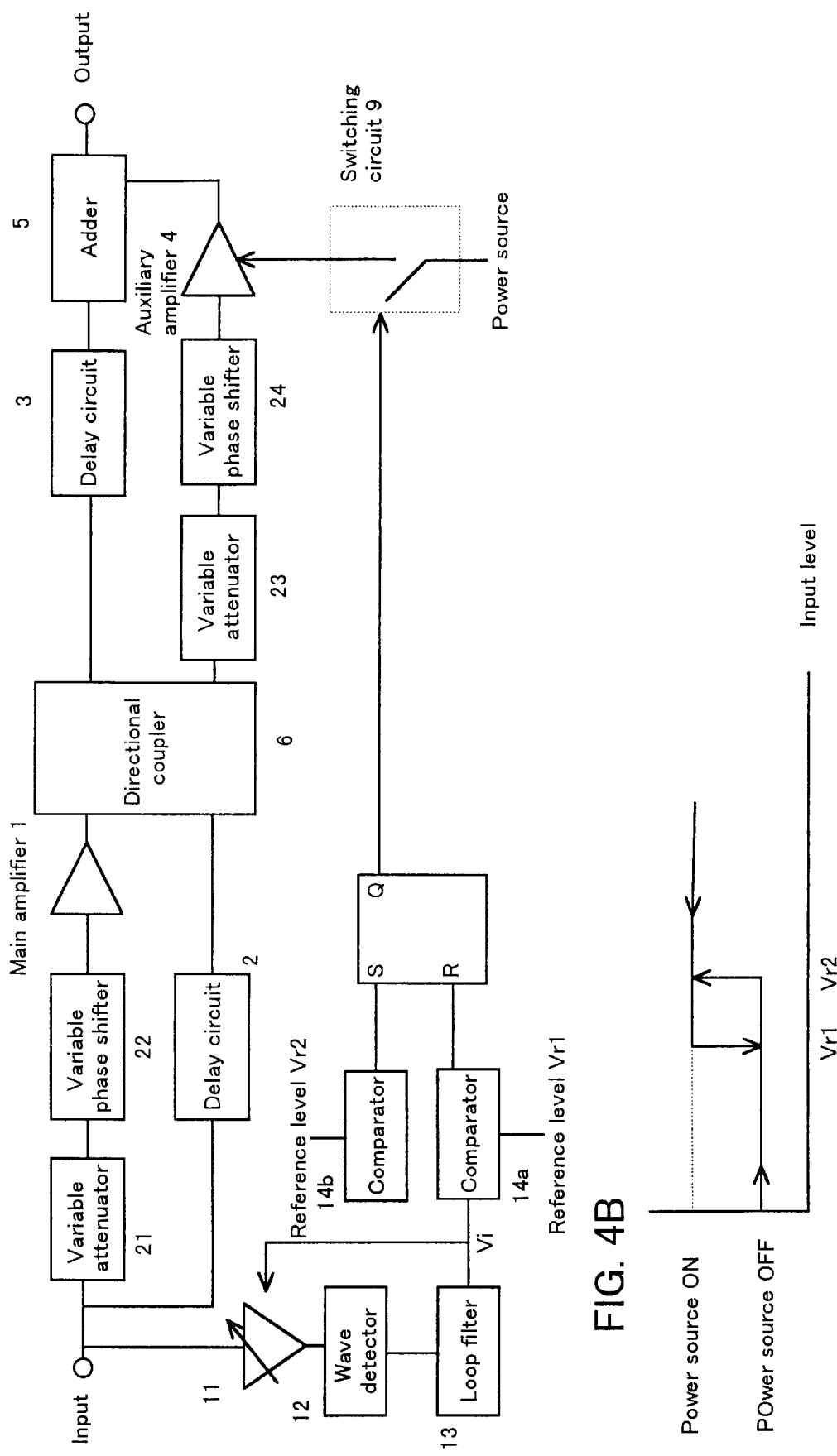
FIGS. 4A and 4B are diagrams illustrating a feed forward amplifier according to a third embodiment of the present invention.

FIG. 4A is a block diagram illustrating a feed forward amplifier according to a third embodiment of the present invention. Rather than the one comparator provided for the feed forward amplifier in FIG. 2, the feed forward amplifier in FIG. 4A includes two comparators 14a and 14b, whose reference levels are Vr1 and Vr2 (Vr1<Vr2), and an RS flip-flop 16, for receiving signals from the comparators 14a and 14b.

As is shown in FIG. 4B, as a consequence of the function performed by the RS flip-flop 16, the level at which a switching circuit 9 is changed from conductive (power-ON) to non-conductive (power-OFF) is the reference level Vr1, and the level at which the switching circuit 9 is changed from non-conductive (power-OFF) to conductive (power-ON) is the reference level Vr2. Therefore, the conductive/non-conductive operation of the switching circuit 9 has a hysteresis characteristic, and the operation of the auxiliary amplifier 4 can be stabilized when the voltage Vi is near the reference Vr.

Figure 5:
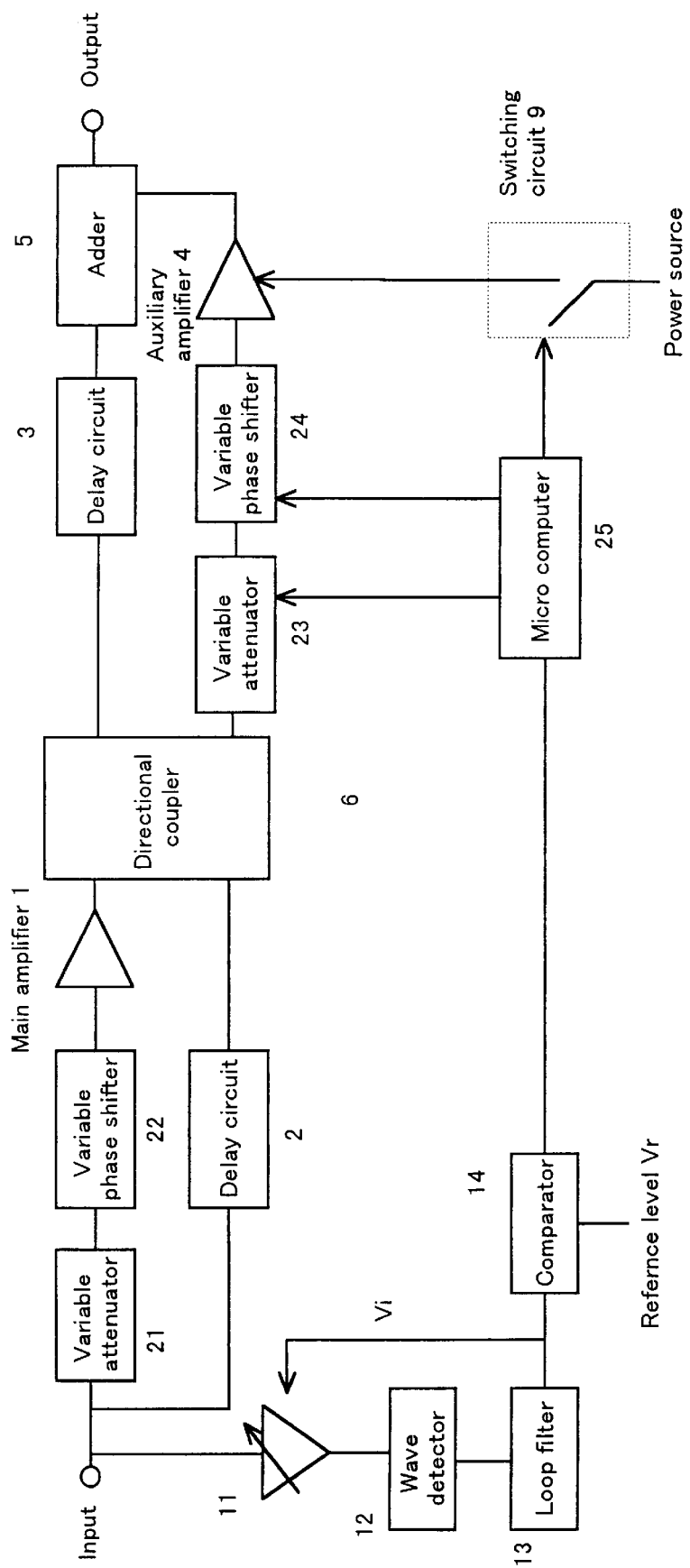
FIG. 5 is a diagram illustrating a feed forward amplifier according to a fourth embodiment of the present invention.

FIG. 5 is a block diagram illustrating a feed forward amplifier according to a fourth embodiment of the present invention. In addition to the components in the arrangement for the feed forward amplifier in FIG. 2, the feed forward amplifier in FIG. 5 includes a microcomputer 25, which is provided with a CPU and a memory, and which controls a switching circuit 9, a variable attenuator 23 and a variable phase shifter 24.

Specifically, upon receipt of a signal from a comparator 14, the CPU of the microcomputer 25 renders the switching circuit 9 conductive or non-conductive. In addition, when the switching circuit 9 is rendered non-conductive, the microcomputer 25 stores in memory control values for the variable attenuator 23 and the variable phase shifter 24. Then, when the switching circuit 9 is again rendered conductive, the microcomputer 25 employs the values stored in the memory as initial values while initiating control of the variable attenuator 23 and the variable phase shifter 24.

As is described above, when the switching circuit 9 is rendered non-conductive the current control values for the variable attenuator 23 and the variable phase shifter 24 are stored. Thereafter, these values are employed as initial values when the operation of the auxiliary amplifier 4 is resumed. When there are no great changes in external factors, therefore, the variable attenuator 23 and the variable phase shifter 24 can be controlled rapidly and appropriately.

Figure 6:
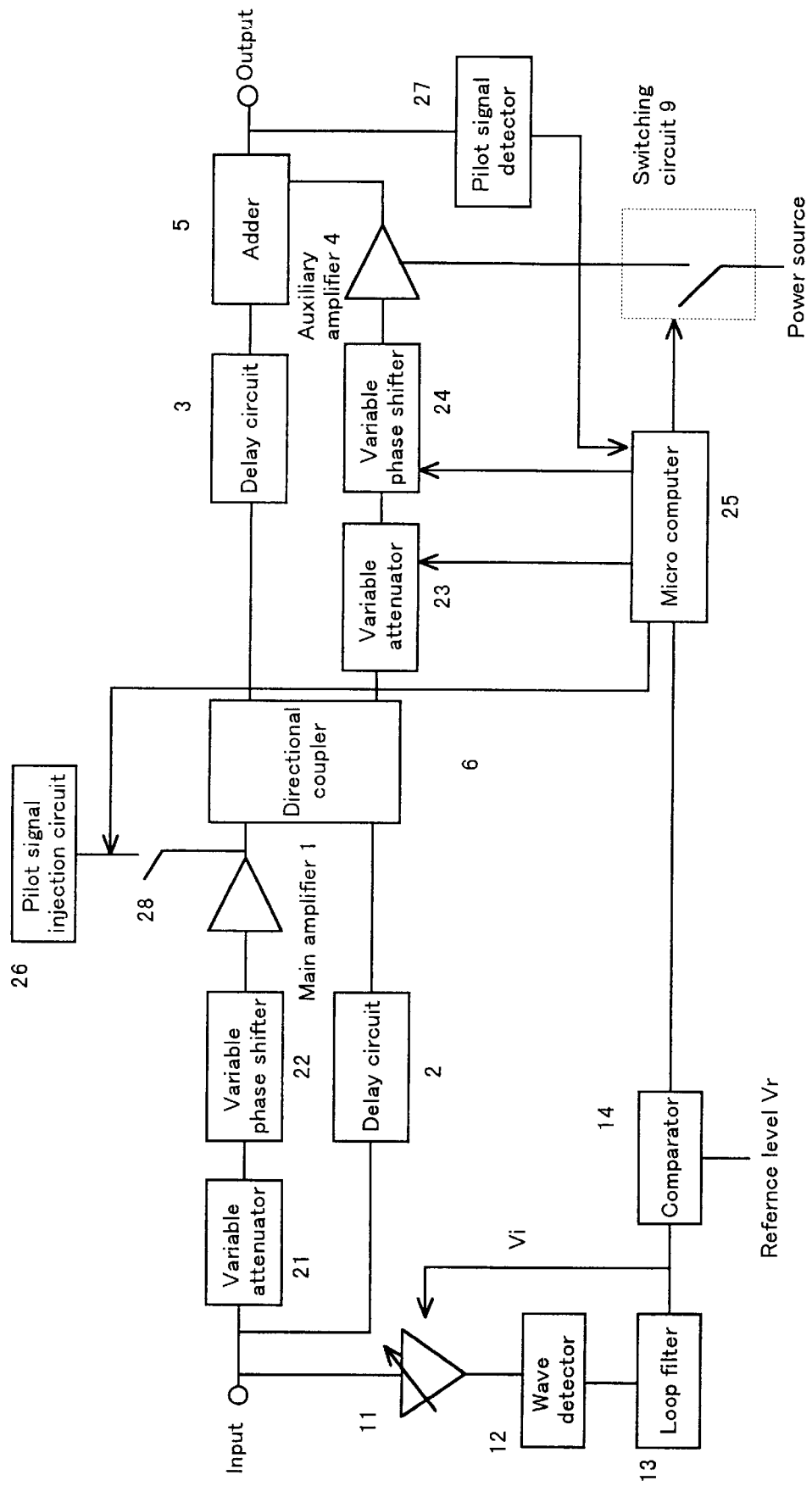
FIG. 6 is a diagram illustrating a feed forward amplifier according to a fifth embodiment of the present invention.

FIG. 6 is a block diagram illustrating a feed forward amplifier according to a fifth embodiment of the present invention. In addition to the components in the arrangement for the feed forward amplifier in FIG. 5, the feed forward amplifier in FIG. 6 includes a pilot signal injection circuit 26, for obtaining optical control values for a variable attenuator 23, and a variable phase shifter 24, and a pilot signal is fed in from the output side of a main amplifier 1. When an auxiliary amplifier 4 is being operated, the phase of one of the pilot signals branched by a directional coupler 6 is shifted 180 degrees by a delay circuit 3, and the shifted signal is synthesized, by an adder 5, with another pilot signal branched by the directional coupler 6. Therefore, when the variable attenuator 23 and the variable phase shifter 24 are appropriately adjusted, the pilot signals are canceled out by the adder 5.

As is described above, in order to optimally control the variable attenuator 23 and the variable phase shifter 24, one part of the output of the adder 5 is input to a pilot signal detector 27, while the microcomputer 25 controls the variable attenuator 23 and the variable phase shifter 24, so that the minimum pilot signal level is detected.

At this time, if the switching circuit 9 is rendered non-conductive and the operation of the auxiliary amplifier 4 is halted, a pilot signal input to the adder 5 will be output without being canceled. In order to prevent this, a pilot signal switching circuit 28 is provided. When the switching circuit 9 is rendered non-conductive, the pilot signal switching circuit 28 is also rendered non-conductive by the microcomputer 25. As a result, when the auxiliary amplifier 4 is not being operated, the output of a pilot signal by the adder 5 can be prevented.

Figure 7:
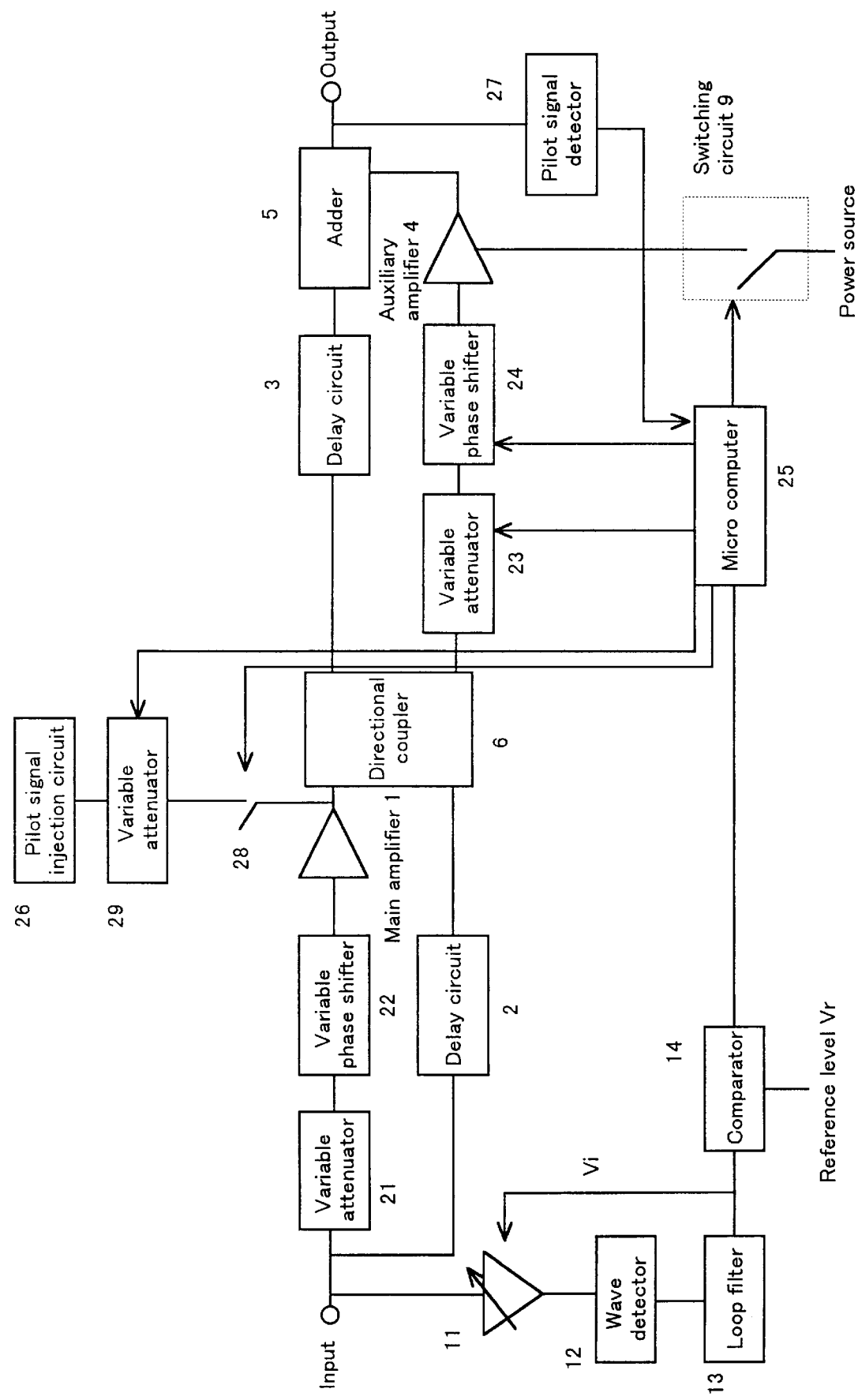
FIG. 7 is a diagram illustrating a feed forward amplifier according to a sixth embodiment of the present invention.

FIG. 7 is a block diagram illustrating a feed forward amplifier according to a sixth embodiment of the present invention. In addition to the components in the arrangement for the feed forward amplifier in FIG. 6, a variable attenuator 29 for adjusting the attenuation of a pilot signal which is fed in is provided for the feed forward amplifier in FIG. 7. When a pilot signal switching circuit 28 is changed from non-conductive to conductive, the input of pilot signals is resumed, a microcomputer 25 adjusts the variable attenuator 29 so that it provides the maximum attenuation, and the level of a pilot signal which is input is reduced to the minimum. Following this, the microcomputer 25 gradually reduces the attenuation provided by the variable attenuator 29, and increases the input levels of the pilot signals until they reach a standard level. As well as in FIG. 5, when to resume the operation of an auxiliary amplifier 4 control of the variable attenuator 23 and the variable phase shifter 24 is to be initiated using control values acquired immediately after the operation of the auxiliary amplifier 4 was halted, and when there was a great change in external factors before and after the operation of the auxiliary amplifier 4, pilot signals are not completely canceled out during a period that continues until the variable attenuator 23 and the variable phase shifter 24 are appropriately adjusted. Thus, by maintaining a low pilot signal input level for the period of time required to appropriately adjust the variable attenuator 23 and the variable phase shifter 24, a minimum level can be maintained for the pilot signals which are output during this period.

Figure 8:
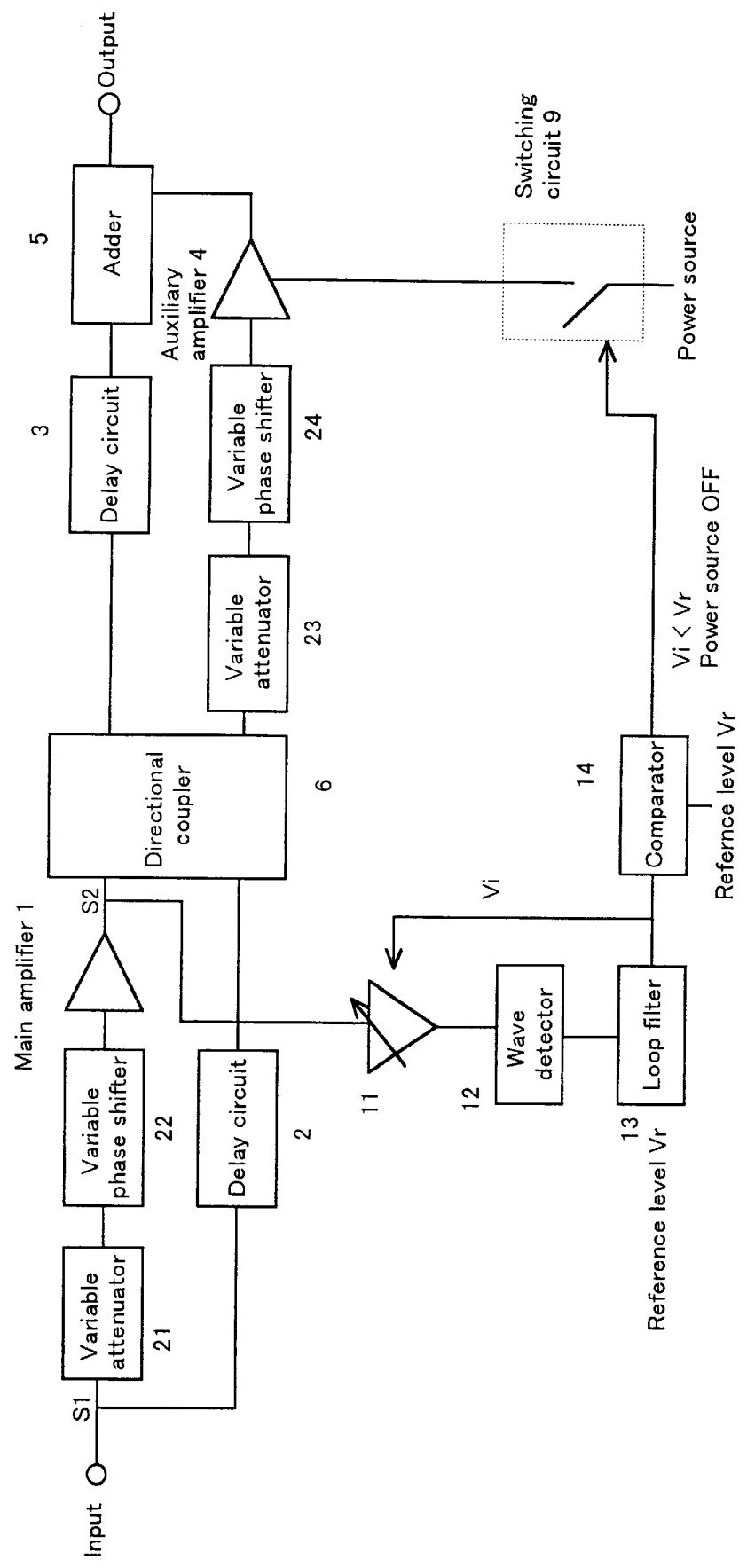
FIG. 8 is a diagram illustrating a feed forward amplifier according to a seventh embodiment of the present invention.

FIG. 8 is a block diagram illustrating a feed forward amplifier according to a seventh embodiment of the present invention. Rather than the procedure performed in the feed forward amplifier in FIG. 2, in the feed forward amplifier in FIG. 8 a signal S2, obtained by a main amplifier 1, is transmitted to a variable amplifier 11 and to a wave detector 12. When the level of an input electrical signal S1 is as low, for example, as the level at the time traffic is light, the electrical signal S2 obtained by the main amplifier 1 is employed to input a signal to the variable amplifier 11 which can be maintained at a constant level or higher, and the input level required for wave detection by the wave detector 12 can be acquired.

As is described above, according to the present invention, the operation of the auxiliary amplifier of a feed forward amplifier can be controlled in accordance with the level of a signal input to the feed forward amplifier. That is, when the level of a distortion element which is generated is low enough to satisfy a required characteristic, and the level of an input signal is low and only the operation of the main amplifier is required, power consumption can be reduced by halting the operation of the auxiliary amplifier.

Therefore, the operating costs for a radio base station can be reduced. And in addition, a power source (battery) for installation in a radio base station can be made compactly, and the size of the radio base station itself can be reduced.

What is claimed is:

1. A feed forward amplifier comprising:
   a first amplifier for amplifying a first signal;
   an extraction unit for extracting a distortion element added to a second signal output from the first amplifier;
   a second amplifier for amplifying the distortion element;
   an adder for inverting the phase of either the second signal or of a third signal output from the second amplifier and for adding these signals; and
   a controller for controlling the supply of power to the second amplifier based on a level of the first signal.

2. The feed forward amplifier according to claim 1, wherein the controller includes:
   a detector for detecting the level of the first signal;
   a comparator for comparing a predetermined reference level with the level detected by the detector; and
   a switching unit for powering on and off the second amplifier in accordance with the result provided by the comparison performed by the comparator.

3. The feed forward amplifier according to claim 2, wherein the switching unit powers on the second amplifier when the detected level is equal to or greater than the reference level, and the switching unit powers off the second amplifier when the detected level is lower than the reference level.

4. The feed forward amplifier according to claim 1, further comprising:
   an isolator for restraining a change of impedance between the second amplifier and the adder.

5. The feed forward amplifier according to claim 2, is further comprising:
   an isolator for restraining a change of impedance between the second amplifier and the adder.

6. The feed forward amplifier according to claim 3, further comprising:
   an isolator for restraining a change of impedance between the second amplifier and the adder.

7. The feed forward amplifier according to claim 1, wherein the comparator has a hysterisis characteristic.

8. The feed forward amplifier according to claim 2, wherein the comparator has a hysterisis characteristic.

9. The feed forward amplifier according to claim 3, wherein the comparator has a hysterisis characteristic.

10. The feed forward amplifier according to claim 1, further comprising:
    an adjuster for adjusting the gain and/or the phase of the second signal or the third signal; and
    a storage unit for storing a value of the adjuster when the second amplifier powers off,
    wherein the controller controls the adjuster by using the value stored in the storage unit when the second amplifier powers on again.

11. The feed forward amplifier according to claim 2, further comprising:
    an adjuster for adjusting the gain and/or the phase of the second signal or the third signal; and
    a storage unit for storing a value of the adjuster when the second amplifier powers off,
    wherein the controller controls the adjuster by using the value stored in the storage unit when the second amplifier powers on again.

12. The feed forward amplifier according to claim 3, further comprising:
    an adjuster for adjusting the gain and/or the phase of the second signal or the third signal; and
    a storage unit for storing a value of the adjuster when the second amplifier powers off,
    wherein the controller controls the adjuster by using the value stored in the storage unit when the second amplifier powers on again.

13. The feed forward amplifier according to claim 1, further comprising:
    an injection unit for injecting a pilot signal to detect a phase deference between the second signal and the third signal,
    wherein the controller controls the injection unit according to the condition of the power supply to the second amplifier.

14. The feed forward amplifier according to claim 2, further comprising:
    an injection unit for injecting a pilot signal to detect a phase deference between the second signal and the third signal,
    wherein the controller controls the injection unit according to the condition of the power supply to the second amplifier.

15. The feed forward amplifier according to claim 3, further comprising:
    an injection unit for injecting a pilot signal to detect a phase deference between the second signal and the third signal,
    wherein the controller controls the injection unit according to the condition of the power supply to the second amplifier.

16. The feed forward amplifier according to claim 13, wherein the controller permits the injection of the pilot signal when the second amplifier powers on and prohibits the injection of the pilot signal when the second amplifier powers off.

17. The feed forward amplifier according to claim 13, wherein the controller control to increase a level of the injected pilot signal gradually when the second amplifier powers on.

18. A feed forward amplifier comprising:
    a first amplifier for amplifying a first signal;
    an extraction unit for extracting a distortion element added to a second signal output from the first amplifier;
    a second amplifier for amplifying the distortion element;
    an adder for inverting the phase of either the second signal or of a third signal output from the second amplifier and for adding these signals; and
    a controller for controlling the supply of power to the second amplifier based on a level of the second signal.

* * * * *